US009064192B2

(12) United States Patent
Liu

(10) Patent No.: US 9,064,192 B2
(45) Date of Patent: Jun. 23, 2015

(54) AUTOMATIC VALID VOTE COUNT STORAGE USING SECURE EMBEDDED NON VOLATILE MEMORY

(75) Inventor: David Liu, Fremont, CA (US)

(73) Assignee: Jonker LLC, Zephyr Cove, NV (US)

( * ) Notice: Subject to any disclaimer, the term of this patent is extended or adjusted under 35 U.S.C. 154(b) by 517 days.

(21) Appl. No.: 13/475,555

(22) Filed: May 18, 2012

(65) Prior Publication Data

US 2012/0296706 A1 Nov. 22, 2012

Related U.S. Application Data

(60) Provisional application No. 61/487,537, filed on May 18, 2011.

(51) Int. Cl.
*G06K 17/00* (2006.01)
*G07C 13/00* (2006.01)

(52) U.S. Cl.
CPC ................ *G06K 17/00* (2013.01); *G07C 13/00* (2013.01)

(58) Field of Classification Search
CPC ...................................................... G07C 13/00
USPC ............................................................ 705/12
See application file for complete search history.

(56) References Cited

U.S. PATENT DOCUMENTS

| 7,270,269 | B2 * | 9/2007 | Iyer et al. | ...................... 235/386 |
| 7,876,615 | B2 | 1/2011 | Liu | |
| 2007/0095909 | A1 * | 5/2007 | Chaum | ........................ 235/386 |
| 2007/0187498 | A1 * | 8/2007 | Haas | ............................. 235/386 |
| 2010/0297826 | A1 * | 11/2010 | Yun | ............................... 438/424 |
| 2012/0209931 | A1 * | 8/2012 | Antell | ........................... 709/206 |

* cited by examiner

*Primary Examiner* — Kimberly Berona
*Assistant Examiner* — Murali K Dega
(74) *Attorney, Agent, or Firm* — Law Office of J. Nicholas Gross, P.C.

(57) ABSTRACT

A non-volatile memory system adapted for securely registering votes within a voting system is described. The votes are encoded as a set of logically grouped cells based on a voter's selection of an item. The encoding assures that the votes are easily distinguishable by a read circuit.

11 Claims, 3 Drawing Sheets

100

AUTOMATIC VALID VOTE COUNT STORAGE USING SECURE EMBEDDED NON VOLATILE MEMORY

RELATED APPLICATIONS

The present application claims the benefit under 35 U.S.C. 119(e) of the priority date of Provisional Application Ser. No. 61/487,537 filed May 18, 2011 which is hereby incorporated by reference.

FIELD OF THE INVENTION

The present disclosure pertains to secure electronic voting devices, systems and methods, particularly those using non-volatile memories.

BACKGROUND

Secure electronic voting devices are well-known in the art. An example is shown in U.S. Pat. No. 7,270,269 to Iyer et al. incorporated by reference herein. In Iyer, a conventional electronic voting system makes use of a write-once recording medium for capturing votes cast by voters. Voters interact with a voting system using a touch screen display or other electronic mechanism for casting votes. The system uses an array of physical electronic fuses to register the votes. Due to their characteristics (i.e., once the fuse is "blown") these fuses cannot be tampered with by restoring them to an unaltered state.

Iyer explains that the benefits of his system include the fact that the fuses are used in removable cartridge form, and have two different modes: 1) a writing mode in which the votes are recorded; and 2) a reading mode during which the votes are identified. An encrypted ID can also be stamped in the cartridge to identify it uniquely. Other types of data could be recorded of course, including an association with a particular voting machine, a particular region, etc. The e-fuse cartridge and array (225) described by Iyer is shown generally in FIG. 2.

Fuse elements have their limitations, however, including the fact that some may require external laser or explosion method for programming. This will require that openings be made to the passivation in the areas of fuse elements. Even in the applications where the fuse elements are electrically programmed, there is a need for special circuitry and special pads that can handle high current in order to supply enough energy to program the fuse. This makes fuse programming implementation not very easily applied at field level. In addition, due to the programming requirement, there is the need to connect one terminal of every programmable fuse element to a power supply or other common node, thus limiting the flexibility in the design of the sensing circuit. One additional issue with the fuse elements is that they are inherently one-time-destructive programming element, making testing and screening at wafer production nearly impossible.

SUMMARY OF INVENTION

An object of the present invention is to improve on the aforementioned prior art systems.

A first aspect concerns a secure voting system including a computing system adapted with a programmable non-volatile memory device to receive and record votes from users for one of N items. The system includes a non-volatile memory array in the programmable non-volatile memory device storing each vote as a logical group of N separate cells to record a vote for one of the N items. Each of the logical group of N separate cells preferably includes an areal capacitively coupled floating gate cell which is programmable to a first logical value or a second logical value.

In some applications the logical group of N separate cells can be read to determine which if any of the N items are represented by the vote. This can be done by an integrated or separate vote interrogation system. To determine the votes, a collective current from the logical group of N cells preferably is sensed to determine the vote.

In some systems a vote decoder circuit can be employed for identifying if a vote is valid or invalid. This circuit is preferably adapted to notify a user of an invalid vote before recording the same in the memory array to permit the user to change the vote.

In preferred implementations selection of a single first item for the vote is represented by an unprogrammed state for a first cell in the logical group of N cells. All other cells of the logical group of N cells for N−1 items are represented by a programmed state.

Each of the logical group of N separate cells is preferably programmable by coupling a drain region to a first reference potential.

In some embodiments a tabulating circuit can be included for counting votes as they are recorded in the non-volatile memory array. The tabulating circuit preferably records an instance of a vote and an accompanying timestamp.

In some instances the votes can be encrypted prior to being recorded.

Control logic can be incorporated as well for initiating and conducting a voting event, for controlling recording of votes in the non-volatile memory array. The control logic preferably communicates with a remote vote interrogation/counting system to register the programmable non-volatile memory device prior to and as a precondition to conducting a voting event.

In some embodiments the programmable non-volatile memory device can be part of an integrated circuit which is part of a portable recording device that can be removed from the secure voting system. A voting process can be implemented so that a vote can be recorded as invalid if more than one item is selected, and/or if no item is selected. In general invalid votes can be encoded by setting all of said logical group of N separate cells to a first logical value. Thus in preferred embodiments a vote can be recorded as valid when at most one item is selected.

Other aspects of the invention concern a non-volatile memory adapted to record data representing a vote for one of N items including: input logic adapted to receive an input vote for one of the N items and generate at least N separate output signals representing a vote for one of the N items, and an array of non-volatile memory cells coupled to the input logic and storing each vote for an item as a logical group of N separate cells. As above, the logical group of N separate cells preferably include at least some which use an areal capacitively coupled floating gate cell which is programmable to a first logical value or a second logical value based on a value of an associated one of the at least N separate output signals from said input logic.

In preferred embodiments, each cell in the logical group of N separate cells has a different size, such as a different drain width or some other parameter.

The input logic preferable generates 2N separate encoding signals for a vote. Reading of the votes can be done by coupling each of the logical group of N separate cells together and sensing a total current.

Another aspect of the invention concerns a non-volatile memory adapted to record data representing a vote for one of N items including: input logic adapted to receive an input vote for one of the N items and generate at least N separate output signals representing a vote for one of the N items; and an array of non-volatile memory cells coupled to the input logic and storing each vote for an item as N values stored in a logical group of N separate cells. In this configuration in a logical group of N separate cells at most a single cell which corresponds to a valid and unique selection has distinct senseable data for an item.

Other aspect of the invention concerns methods of operating a secure voting system, including the programming of the cell, a vote recording process, a vote decoding process, a vote interrogation process and a vote tabulation process.

DETAILED DESCRIPTION

Figure 1:
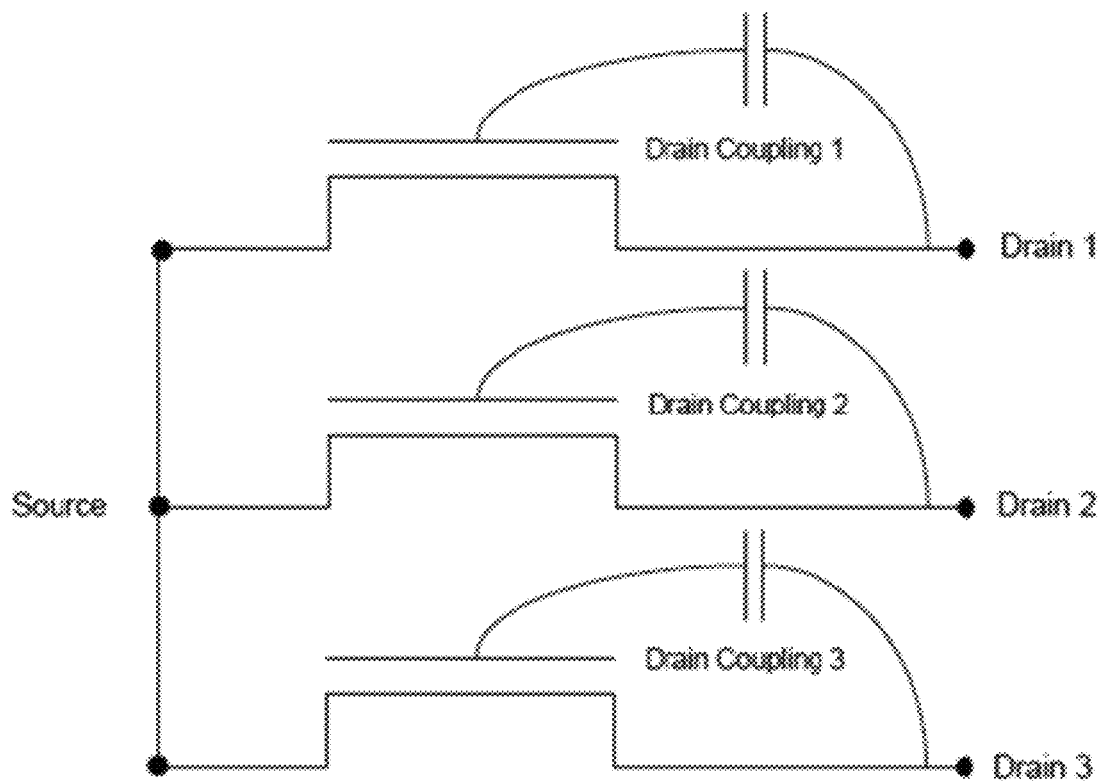
FIG. 1 depicts an embodiment of a memory cell used in preferred embodiments of the present teachings.
Figure 2:
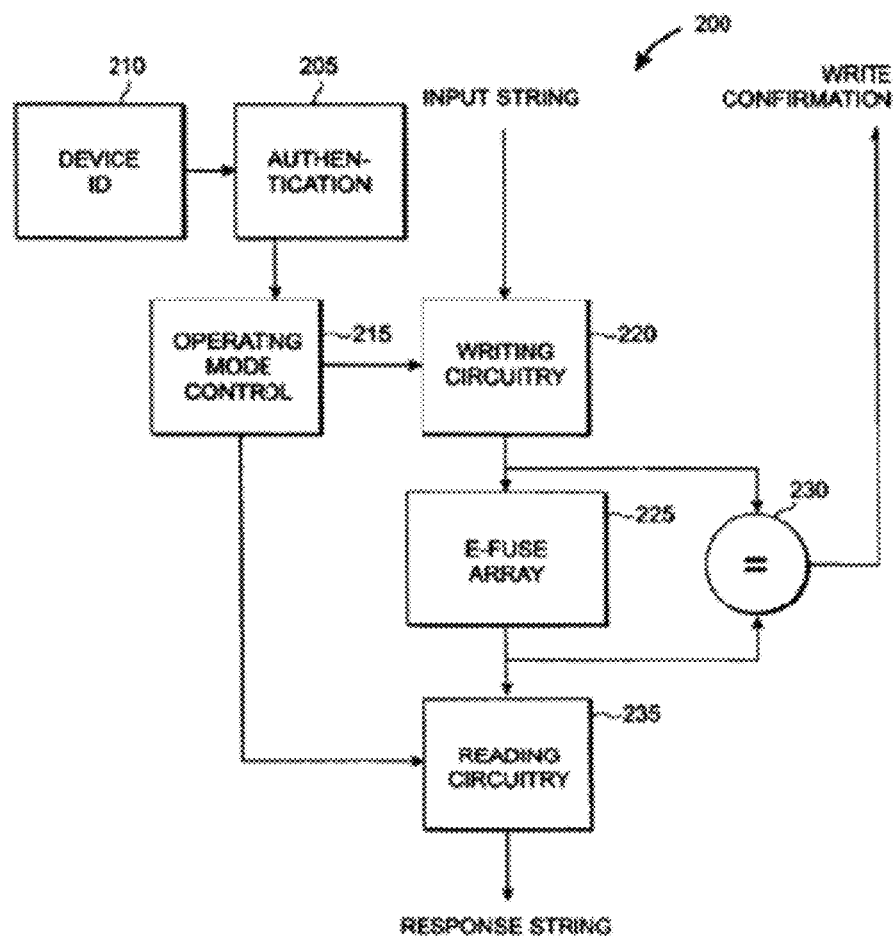
FIG. 2 depicts a prior art secure voting system.

Recently an improved and novel non-volatile memory (NVM) cell was introduced by the applicant in U.S. Pat. No. 7,876,615 also incorporated by reference herein. In the '615 patent, the cell can be programmed using variable capacitive coupling between a drain region and a floating gate.

Applicant submits that one fitting application for the variable coupling non-volatile memory cell of the '615 patent is in the area of a secure voting machine as a drop-in, or pin-for-pin replacement for the conventional e-fuse technology shown in the prior art, which may be in integrated circuit form. The non-volatility of the data in a voting cell made from this type of memory building block (as with an e-fuse) allows the storage of the voting results permanently without the possibility of being inadvertently destroyed. Note that all the functionality described in the aforementioned Iyer type secure voting system would be possible with the present vote recording scheme as well.

Unlike fuse elements, however, preferred embodiments of voting devices and machines using the present teachings would have the following benefits: (1) no special equipment or additional investment are required for programming; (2) programming is very easy and rapid, no explosion of fuse material to possibly scatter all over the die, and damage other circuit functionality; (3) testing, programming, and verification can all be done in the same automated electrical operation step; (4) programming is done at field level, not restricted to manufacturing step. Thus it is expected that many embodiments of secure voting machines would benefit from voting media implementing the present teachings.

In terms of choices for the voting cell 100, N-channel types of flash cell are more suited in certain circumstances. By using n-channel flash memory cells, the vote cell 100 can be programmed to shut off the channel current. Thus a scheme can be devised with a set of n-channel flash memory cells each with unique cell width to implement voting result storage.

As an example, consider an election in which there is possible voting for 3 candidates running in the race.

In this instance of 3 candidates, the aforementioned variable coupling/multi-input cell from the '615 patent is configured with three different drain nodes, each with a different size. It will be understood therefore that the number of different sized drain nodes can be a function of the number of candidates running in the race. It may be desirable, in some instances, to simply construct an integrated circuit to accommodate N-different candidates, and permit final configuration of the number of candidates to be selected at election time. In addition, different sized cells may be manufactured to include a different upper limit of 4, 8, 16, etc. candidates, with the final selection made at election time. Note that in some applications a combination of prior art fuse cells and the present inventive cells may be used.

Accordingly in the scenario with 3 candidates, the cell 100 preferably would have the following characteristics:

Drain 1: Transistor Width W
Drain 2: Transistor Width 2 W
Drain 3: Transistor Width 4 W For a cell group for N candidates/items and transistors, the Nth transistor width is preferably $2^{N-1}$ W. Other transistor configurations are of course possible, and the invention is not limited in this respect.

Figure 3:
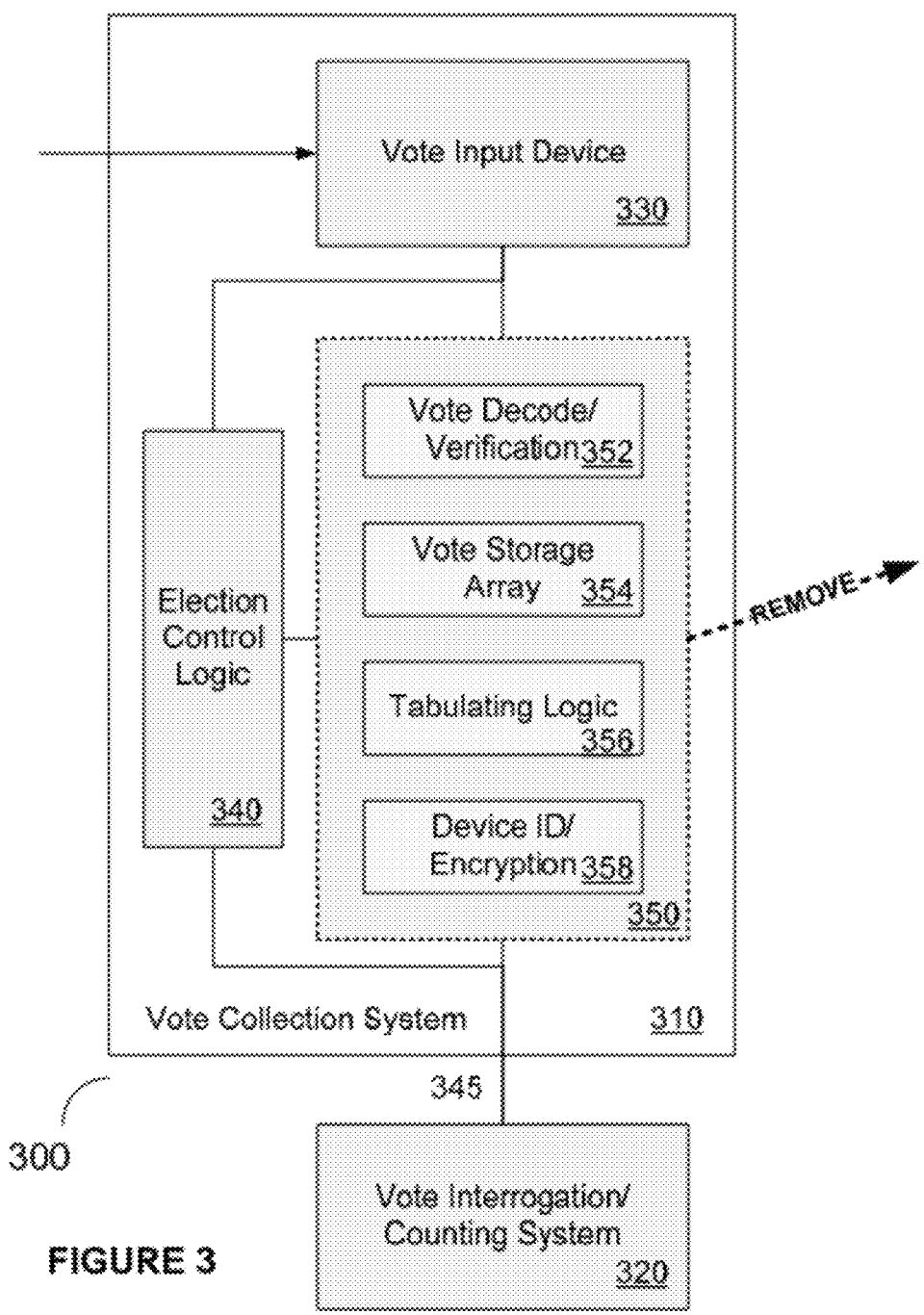
FIG. 3 depicts a diagram of a preferred embodiment of a secure voting system implemented in accordance with the present teachings.

The cell (and the logical 3 cell group for the vote) is used as part of a vote storage device seen in FIG. 3. This shows a preferred embodiment of a secure voting system 300 including generally a secure vote collection system 310, and a vote interrogation system 320. While shown as separate systems, it will be understood of course that they could be implemented as a single integrated system. In a preferred embodiment the systems 310, 320 are collections of standalone or networked computers which are programmable via firmware, software or both, and can be accessed through at least a secure network communications channel 345.

In the system shown in FIG. 3, a voter casts a vote through a vote input device 330, which may take any conventional form, including an electronic interface for presenting candidates and receiving input through manual touch and/or a pointing device of some kind. In some instances a portable electronic device, such as a smartphone, may use a near field communications technique or other suitable communications channel (WiFi, Bluetooth, RF) to provide voting input. Voting could take place, for example, in a virtual voting booth supported by a wireless vote collection system within a limited physical geographic area, including for example a single building, room, etc.

Within system 310 a set of firmware or software control routines are preferable used to implement election control logic 340. This latter control logic can be configured to set up the vote collection system 310 for any particular election and exercise administrative control during an election voting period. Thus, for example, it may be configured to identify the names of acceptable candidates (and their order) on an input screen (not shown), start and stop a vote collection process within a defined voting period, initialize and set up vote input device 330, vote collection device 350, allow the latter to be interrogated by interrogation system 320, allow for the device 350 to be removed securely, etc. It will be understood that any number of suitable password or encryption mechanisms known in the art may be employed to control execution of the voting process, allow interrogation of the vote collection system 310, etc.

After the voter casts his/her vote for an item or candidate, the vote collection device 350 is activated to process the vote. Note that device 350 is preferably self-contained as a single integrated circuit device with logic and memory that mimics the behavior and function of the prior art "cartridge" discussed above, in that it (or a board on which it is located) can be removed from the voting system 310 for archival and/or security reasons, including vote verification. Thus device 350 can be in the form of a printed circuit board, a USB type plug in device, or any other convenient form factor. Control logic 340 can be further configured to only permit the addition or removal of the vote collection device 350 by an authorized administrator using password control, encryption keys, etc.

During the user voting process a vote verifier/decoder 352 reads the marked choice (or choices when multiple candidates are invalidly marked), and converts these to signals for the cells to be programmed. The decoder logic 352 can be implemented with any form of conventional programmable logic, firmware or other suitable circuitry known in the art based on the functional description given herein. The votes are thus stored in the form of electrical charge in a NVM vote storage array 354, which is configured as noted above.

Optional tabulating logic 356 can also be employed in some embodiments for keeping: 1) a running tally of raw votes cast for each item/candidate, and/or 2) creating an electronic journal of the votes. In the first instance the system may employ a generic counter that is incremented whenever a vote for a particular item/person is identified by the decoding logic. Note that the optional counter(s) can be used as a rough double check or verification by a vote interrogations system 320 while tabulating the votes recorded in array 354.

In the second instance the system can be programmed to simply record the fact of the vote, along with a timestamp. This information, too, can be used for planning purposes and other data metrics. In the case of a handheld vote input device 330, a confirmation can be sent to the user's device verifying the selection and validity of the user's vote.

The tabulation data, too, may be made accessible as desired to a vote interrogation system as an additional verification system. As with the decoder above, tabulating logic 356 can be implemented with any form of conventional programmable logic, firmware or other suitable circuitry known in the art based on the functional description given herein. Note that in some embodiments it may not be desirable to collect such tabulating data for security reasons.

As alluded to above, additional device identification data and encryption data or keys 358 can be associated and stored on the device 350 as well. Data associated with the particular election, the polling site, the beginning and ending of the polling period, identifying details for the user's vote input device 330, etc., can also be recorded as desired by control logic 340.

To read the votes, a separate vote interrogation/counting system 320 is preferably employed. This system can either communicate over a network 345 to interact with election control logic 340 and read device 350, or it can be configured to receive the vote collection devices 350 individually. The vote reading/counting system 320 can be implemented by a skilled artisan using any conventional electronic circuitry, including hardwired logic, firmware, software, or some combination thereof. Note that the latter devices preferably communicate at least their presence at some point in the election process to permit vote interrogation/counting system 320 to compile a complete profile of the voting systems 310 participating in an election. This data can be used also to ensure later on that each polling site has been accounted for.

Control logic 340 can be configured, if desired, to make sure that the voting process cannot take place until devices 350 are "registered" with a vote interrogation/counting system 320, which, again in some instances may be a remote computing system communicating over a secure protocol for security reasons. The control logic 340 again may be some combination of conventional hardware and software readily available to skilled artisans.

The votes are recorded securely within array 354. This will involve two separate steps to ensure that both valid votes as well as invalid votes are properly accounted. A first step involves properly transferring the voting data into the flash memory cell. Each cell (in a logical group of N cells corresponding to a vote for one of the N items/candidates) is marked by vote marking/programming system 320. To do this, when a candidate is read as being marked for vote, the drain node corresponding to the candidate is left unprogrammed while the rest of the drain nodes corresponding to the unselected candidates are set to a high voltage for the particular cell to be programmed. Thus anytime if more than one candidate is selected for a vote, this will result in all the drain nodes to be set at high voltage and all the N cells are rendered programmed.

To identify and count the votes securely, each cell (in a logical group of N cells corresponding to a vote for one of the N items/candidates) is interrogated by vote interrogation/counting system 320. To do this the total current of all the drain is read (any time after programming) to determine if and which valid candidate has been voted.

For example, if Candidate A is marked, Decoder logic 352 will set Drain AA for a $1^{st}$ cell to 0V, and Drains BB and CC for $2^{nd}$ and $3^{rd}$ cells to high Vpp voltage during programming step. If more than one candidate is marked, then all the 3 drain nodes are preferably set at Vpp during the vote encoding/programming step. So after the programming step is done, a valid vote will only have one unique cell (from the group of N cells) that is not programmed and the other two cells are programmed. An invalid vote (with more than one candidate marked or no candidate marked) is decoded to cause all 3 (or N) cells being programmed. The result is that only when there is a valid vote, there is a sensible current whose value will correspond to the its associated candidate.

Accordingly if Candidate A is validly voted, only Drain AA read path will have a sensed current which is proportional to W. No other read path will have a sensed current, so a Vote for Candidate AA is identified and recorded. Similar sensing would be done to identify votes for Candidate B and Candidate C (or any number N candidates/items)

Description and Purpose of Vote Decoder 352

One additional concept used in preferred embodiments of the invention is that if more than one of the candidates is marked on the voting ballot, the output from decoder 352 should preferably render an invalid vote. Furthermore the output of decoder 352 can be used to inform a voter that the vote is potentially invalid before it is finally written. This would have the benefit of permitting the voter to change and conform the vote before it becomes registered as a final invalid (or useless) vote. Control logic 340 may also be employed to identify the specific problem to the voter (i.e., no candidate selected, more than one selected, etc.) This data again can be communicated to a voting terminal, the user's handheld device, etc.

In addition, if no candidate is marked at all, the output could also render an invalid vote. The preferred way to do this is by programming (or encoding) every cell in the vote group except for the cell that corresponds to each of the candidates marked on the ballot. This decoding of the voter's input vote (and encoding of the recorded vote) scheme ensures that if more than one candidate is marked, then all the cells are programmed and there will not be any detectable current from any of the cells. In the scenario where no candidate is marked, there should also not be any detectable current from any of the cells as well. Thus the vote is decoded in a manner that identifies an output that is rendered invalid in those cases where something other than a single unique candidate is voted. A valid vote will only have sensible current from a single cell (in the N cell vote group) corresponding to the selected candidate.

As an example of the decoder scheme and the output to the drain of each respective cell for programming, a 3-candidate Boolean table will be listed below:

| Candidate Marked on Ballot | | | Output to Drain of Cell for Programming | | | Comments Vote |
|---|---|---|---|---|---|---|
| A | B | C | AA | BB | CC | Count |
| 0 | 0 | 0 | H | H | H | Invalid |
| 0 | 0 | 1 | H | H | L | Valid |
| 0 | 1 | 0 | H | L | H | Valid |
| 0 | 1 | 1 | H | H | H | Invalid |
| 1 | 0 | 0 | L | H | H | Valid |
| 1 | 0 | 1 | H | H | H | Invalid |
| 1 | 1 | 0 | H | H | H | Invalid |
| 1 | 1 | 1 | H | H | H | Invalid |

This procedure is repeated for all votes and decoding. Again the circuitry for generating the outputs based on the vote inputs can take any number of forms known in the art.

In a preferred embodiment, decoding or reading of the cell group is done by connecting all the drains together in the cell group and sensing the total drain current. The current then is either 0 (invalid) or X, 2 X or 4 X depending on the candidate that was voted for.

What is claimed is:

1. In a secure voting system including a computing system adapted with a programmable non-volatile memory device to receive and record votes from users for one of N items, the improvement comprising:
   a non-volatile memory array in the programmable non-volatile memory device coupled to a processor of the computing system storing each vote as a logical group of N separate cells to record a vote for one of the N items;
   wherein each of the logical group of N separate cells includes an areal capacitively coupled floating gate cell which is programmable to a first logical value or a second logical value;
   further wherein each of the logical group of N separate cells is programmable by coupling a drain region to a first reference potential.

2. The system of claim 1 wherein an output of said logical group of N separate electronic cells also identifies a validity of said vote.

3. The system of claim 1 wherein the programmable non-volatile electronic memory device is part of an integrated circuit which is part of a portable recording device that can be removed from the secure voting system.

4. In a secure voting system including a computing system adapted with a programmable non-volatile electronic memory device to receive, record and validate electronic votes from users for one of N items (N>1), the improvement comprising:
   a non-volatile electronic memory array in the programmable non-volatile memory device coupled to a processor of the computing system storing each vote as a logical group of N separate electronic cells to record a vote for one of the N items;
   wherein said logical group of N separate electronic cells includes:
   1) N first drain regions adapted to receive a vote program data signal;
   2) at least N areal capacitively coupled floating gates which are coupled to a respective one of said N first drain nodes and are programmable to a first logical value or a second logical value based on a value of said vote program data signal;
   3) N output terminals adapted to output a programmed vote identifying a value and validity of a vote recorded by said logical group of N separate electronic cells.

5. The system of claim 4 wherein each of said N drain regions has a different size.

6. The system of claim 5 wherein a first drain has a width W, a second drain region has a width 2 W, and any nth additional drain region is characterized by a width $(2n-1)*W$.

7. The system of claim 4 wherein a different areal capacitive coupling between a drain and floating gate is effectuated in each of said N separate electronic cells.

8. The system of claim 4 wherein said non-volatile memory array is configured to be programmed in a voting machine, and is removable and readable by a separate vote interrogation system.

9. The system of claim 4 wherein a single first item for said vote is represented by an unprogrammed state for a first cell in the logical group of N cells, and all other cells of the logical group of N cells for N−1 items are represented by a programmed state.

10. The system of claim wherein reading of the votes can be done by coupling each of the logical group of N separate cells together and sensing a total current.

11. The system of claim 4 wherein said N cells are n-channel devices that are programmed to shut off a channel current.

* * * * *